United States Patent

Sagawa et al.

Patent Number: 5,844,931
Date of Patent: Dec. 1, 1998

[54] SEMICONDUCTOR LASER DEVICES

[75] Inventors: Misuzu Sagawa, Kokubunji; Kiyohisa Hiramoto, Tokyo; Tomonobu Tsuchiya, Kodaira; Takashi Toyonaka, Hachioji; Kazunori Shinoda, Shiki, all of Japan

[73] Assignee: Hitachi, Ltd., Tokyo, Japan

[21] Appl. No.: 903,881

[22] Filed: Jul. 31, 1997

Related U.S. Application Data

[63] Continuation of Ser. No. 408,278, Mar. 22, 1995, abandoned.

[30] Foreign Application Priority Data

Mar. 25, 1994 [JP] Japan .................................. 6-055420

[51] Int. Cl.$^6$ ................................................ H01S 3/19
[52] U.S. Cl. ............................................ 372/45; 372/46
[58] Field of Search .................................. 372/43–46, 50

[56] References Cited

U.S. PATENT DOCUMENTS

| | | | |
|---|---|---|---|
| 4,722,088 | 1/1988 | Wolf | 372/44 |
| 5,155,738 | 10/1992 | Ijichi et al. | 372/46 |
| 5,388,116 | 2/1995 | Ohkubo et al. | 372/46 |
| 5,577,063 | 11/1996 | Nagai et al. | 372/45 |

FOREIGN PATENT DOCUMENTS

| | | |
|---|---|---|
| A-0297885 | 6/1988 | European Pat. Off. . |
| A-0539162 | 10/1992 | European Pat. Off. . |
| A-0589727 | 9/1993 | European Pat. Off. . |
| 2222307 | 7/1989 | United Kingdom . |

OTHER PUBLICATIONS

M. Sagawa et al., "Advantages of InGaAsP Separate Confinement Layer . . . ", Electronics Letters, Aug. 13, 1992, vol. 28, No. 17.

Y. Sin et al., "High–Power InGaAs–GaAs Strained Quantum Well Lasers . . . ", Journal of Applied Physics, vol. 72, No. 7, Oct. 1, 1992, pp. 3212–3214.

M. Ohkubo et al., "0.98 $\mu$m InGaAs–InGaAsP–InGaP GRIN–SCH SL–SQW Lasers . . . ", IEEE Journal of Quantum Electronics, vol. 29, No. 6, Jun. 1993, pp. 1932–1935.

G. Zhang et al., "Optimization and Characteristics of Al–Free Strained—Layer InGaAs/GaInAsP/ . . . ", IEEE Journal of Quantum Electronics, vol. 29, No. 6, Jun. 1993, pp. 1943–1949.

M. Sagawa et al., "High Power COD–Free Operation . . . ", Electronics Letters, vol. 30, No. 17, Aug. 1994, pp. 1410–1411.

Sin et al., "InGaAs–GaAs–InGaP Channel Guide . . . ", Elect. Lett. Jun. 18, 1992, vol. 28, No. 13 pp. 1234–1235.

Primary Examiner—Rodney B. Bovernick
Assistant Examiner—Yisun Song
Attorney, Agent, or Firm—Antonelli, Terry, Stout & Kraus, LLP

[57] ABSTRACT

A semiconductor laser which does not cause a sudden failure due to an electric surge. A ridge that is formed by a GaAs buffer layer, an n-InGaP cladding layer which is lattice-matched to a GaAs substrate, a strained-quantum well active layer, a p-InGaP cladding layer which is lattice-matched to the GaAs substrate, a p-GaAs waveguide layer, a p-InGaP cladding layer which is lattice-matched to the GaAs substrate, and a p-GaAs cap layer is constructed on the n-GaAs substrate by being buried therein by an n-InGaP current-blocking layer. A device stripe is constructed by a current-injected region in the device and current-non-injected regions near facets.

36 Claims, 8 Drawing Sheets

SEMICONDUCTOR LASER DEVICES

This application is a continuation of application Ser. No. 08/408,278, filed on Mar. 22, 1995 now abandoned.

BACKGROUND OF THE INVENTION

The invention relates to a semiconductor laser device and, more particularly, to a semiconductor laser apparatus which is suitable for a pumping light source of an Er-doped fiber amplifier in an optical communication system.

At present, a semiconductor laser of a high power and a band of 0.98 μm having an InGaAs strained-quantum well active layer is actively being studied as a light source for pumping an Er-doped fiber amplifier. For example, Y. K. Sin et al. obtained a light power of 302 mW by a semiconductor laser having a band of 0.98 μm. ("Electronics Letters", Jun. 18th, 1992, Vol. 28, page 1234).

As a light source for pumping an Er-doped fiber amplifier which is used in the optical communication system, a semiconductor laser which stably operates for a long time, e.g., one hundred thousand hours or longer is required. Namely, because of the gradual degradation that would result in such semiconductor laser over a demanded use period of a hundred thousand hours or longer, a withstanding against a sudden failure which is caused by an electric surge is also required. Since such an electric surge suddenly occurs without any warning, it becomes a fatal defect when the semiconductor laser is applied to an actual system. To prevent the sudden failure by the electric surge, it is sufficient to realize a device which does not cause a COD (Catastrophic Optical Damage) breakage. In the above reported example, however, a COD occurred. Thus, there was no withstanding for the surge, and the sudden failure due to the electric surge could not be prevented.

SUMMARY OF THE INVENTION

It is an object of the invention to provide a semiconductor laser device which has a high reliability as a light source for pumping an Er-doped optical fiber amplifier and, particularly, which does not cause a sudden failure due to an electric surge, namely, which does not cause a COD.

The above object is accomplished by providing a current-non-injected region in a region adjacent to a facet of a stripe portion in a semiconductor laser device having an InGaAs active layer and cladding layers. In this instance, it is desirable that the length of the region in which no current is injected is set to 10 to 50 μm. The above object is accomplished, particularly, when an InGaAs layer constituting the above-mentioned active layer is formed of one or two layers. The above object is also accomplished when at least one of the layers constituting the cladding layer is formed of InGaAsP or InGaP. It is desirable that an optical guide layer whose refractive index is lower than that of the active layer and is higher than that of the cladding layer is provided between the active layer and the cladding layer. An effect of the above object is remarkable in a device having a structure such that a ridge is formed by etching a cladding layer on the side opposite to a substrate so that only the outside portion of a stripe region does not reach an active layer, a waveguide is formed by allowing a layer having an InGaP layer to grow in the ridge portion by a regrowth, a high-refractive-index semiconductor layer of at least one layer which is made of InGaAsP or GaAs and has a refractive index higher than that of the cladding layer is formed in only the stripe region in the semiconductor cladding layer on the side opposite to the GaAs substrate, and the high-refractive index semiconductor layer is substantially completely eliminated from that part of semiconductor laser device outside of the stripe region. A wavelength of a laser beam of the semiconductor laser device lies within a range of 0.9 μm to 1.1 μm.

The operation of the invention will now be described hereinbelow. A degradation mechanism by the electric surge will be first explained. When an electric surge occurs, an overcurrent instantaneously flows in the device. In this instance, the device temporarily generates a large light output by the current injection. When such a phenomenon occurs in the device with the conventional structure, what is called a COD (Catastrophic Optical Damage) breakage occurs such that the facet of the device is fused by the laser beam which is generated from the device itself, resulting in the device degradation. To prevent such a device degradation, it is sufficient to realize a device which does not cause a COD. The invention intends to realize a device which does not cause a COD.

The operation of the invention will now be described with reference to FIGS. 3A and 3B and 4A and 4B. FIGS. 3A and 3B are diagrams for explaining a conventional structure. FIG. 3A is a top view of a device. FIG. 3B shows a temperature distribution 60 in a cross section taken along the line 3B—3B in FIG. 3A. Ordinarily, a current is injected into the whole region in the stripe. Therefore, the carrier distribution in the stripe is almost constant in the inner portion. However, although the temperature distribution 60 in the stripe is almost constant in the central portion of the device as shown in FIG. 3B, the temperature rises in the device facet portion. This is because in the device facet portion, a current due to non-radiative recombination flows through the level in a band gap and a heat is generated. Since the band gap decreases due to the heat generation, an absorption coefficient for the laser beam rises and the temperature further increases. When a drive current is raised, the temperature finally reaches a melting point of crystal, so that the crystal is fused and the device is destructed. FIGS. 4A and 4B are diagrams showing a structure according to the invention. FIG. 4A is a top view of a device. FIG. 4B shows a temperature distribution 61 in a cross section taken along the line 4B—4B in FIG. 4A. According to the present structure, a current is injected into only a stripe portion 20 in the device. No current is injected to facet regions 21. Therefore, the carrier distribution in the stripe portion is almost constant in the inner portion. However, since no current is injected into the device facet portion, the carrier density is small. Therefore, a temperature increase by the non-radiative recombination as mentioned above does not occur. Thus, a temperature of the stripe portion hardly rises even in a device facet as shown in FIG. 4B. Consequently, no laser beam is absorbed in the device facet and a device degradation due to a fusion of a crystal at the facet by the absorption of the self-light does not occur. The device which does not cause a COD can be realized as mentioned above.

DESCRIPTION OF THE PREFERRED EMBODIMENTS

Embodiments of the present invention will now be described hereinbelow with reference to FIGS. 1 to 2 and 5 to 9.

Embodiment 1

Figure 1:
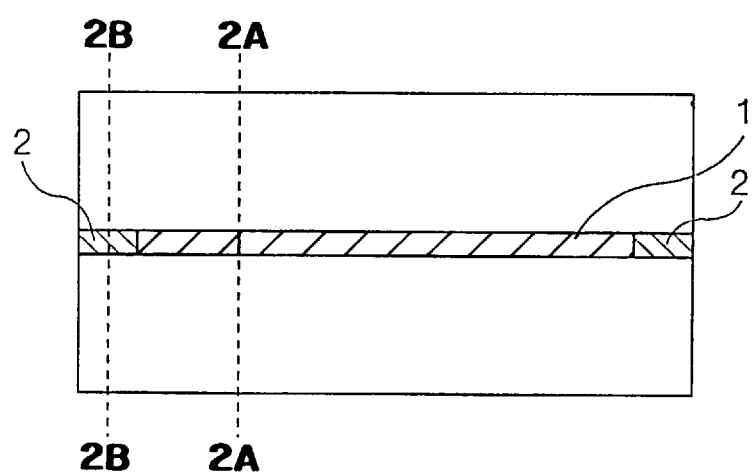
FIG. 1 is a diagram showing a top view of the first embodiment according to the invention.
Figure 2A:
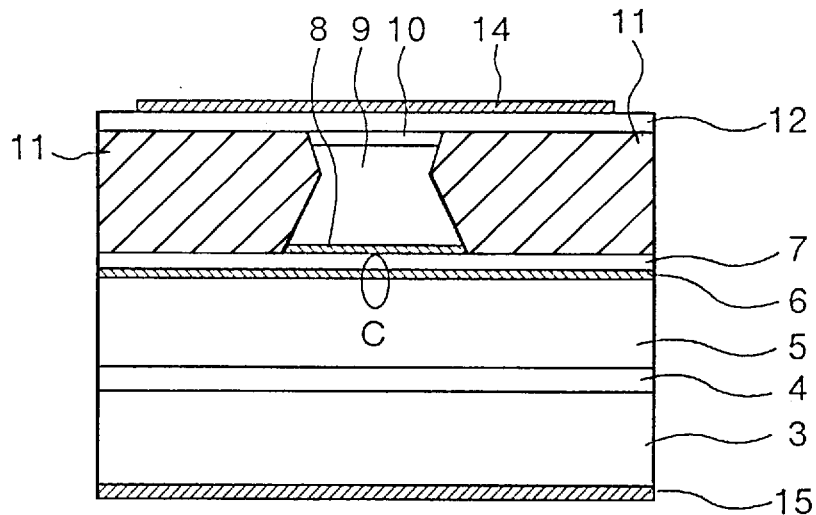
FIG. 2A is a cross sectional view taken along the line 2A—2A in FIG. 1.
Figure 2B:
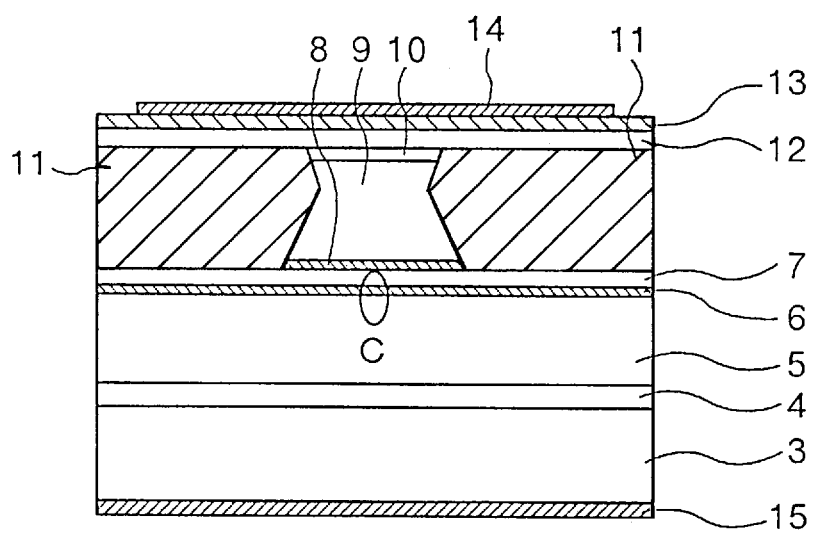
FIG. 2B is a cross sectional view taken along the line 2B—2B in FIG. 1.
Figure 2C:
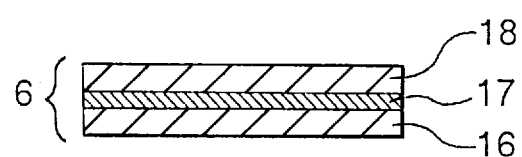
FIG. 2C is an enlarged diagram of an active layer portion C in FIGS. 2A and 2B.
Figure 3A:
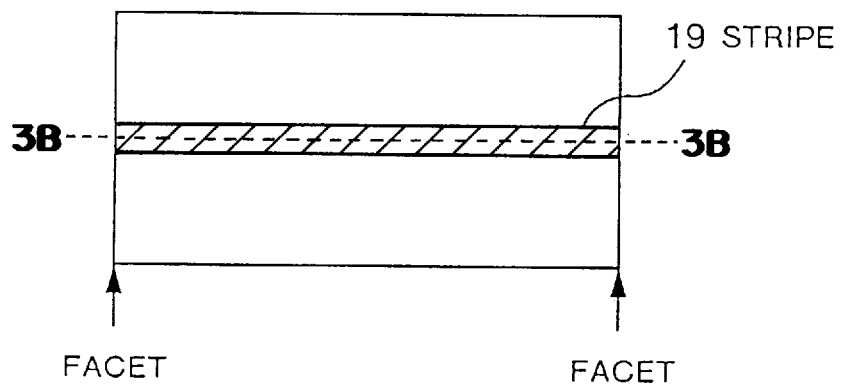
FIG. 3A is a top view of a device according to a conventional structure.
Figure 3B:
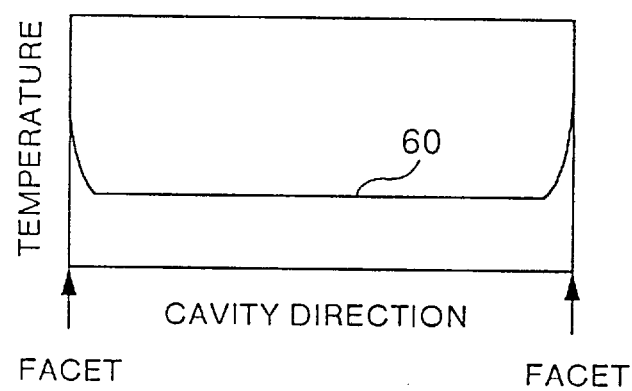
FIG. 3B is a diagram showing a temperature distribution in a cross section taken along the line 3B—3B in FIG. 3A.
Figure 4A:
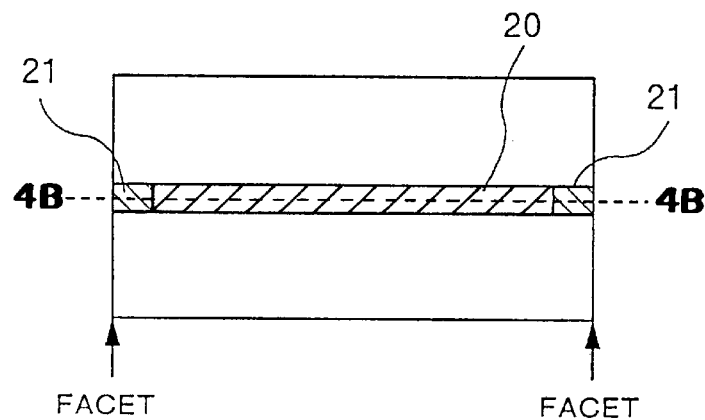
FIG. 4A is a top view of a device according to the invention.
Figure 4B:
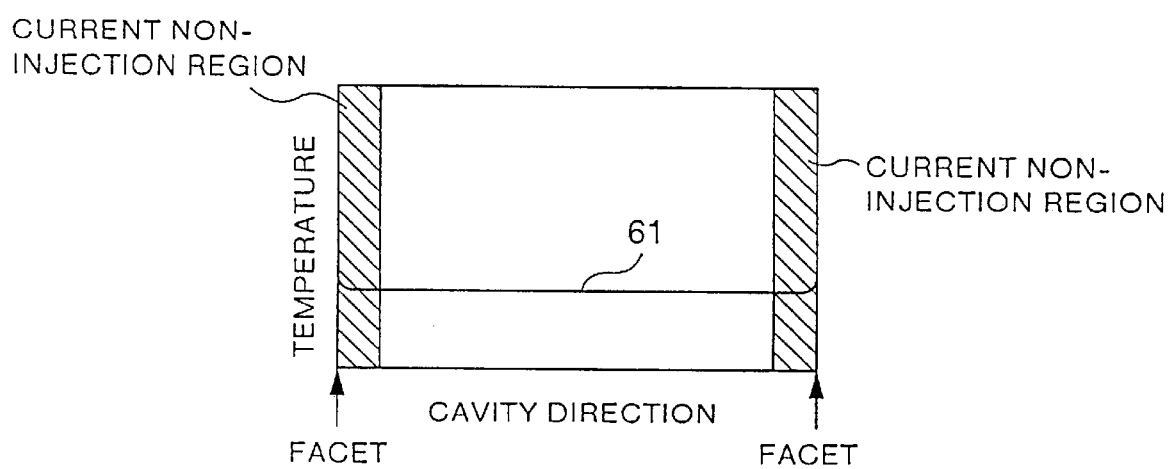
FIG. 4B is a diagram showing a temperature distribution in a cross section taken along the line 4B—4B in FIG. 4A.

The first embodiment of the invention will now be described with reference to FIGS. 1 and 2. FIG. 1 shows a top view of a device. As shown in FIG. 1, a stripe is made up of a current-injected region 1 in the device and a current-non-injected region 2 of a portion near facets. FIGS. 2A and 2B show cross sectional structures taken along the lines 2A—2A and 2B—2B in FIG. 1. FIG. 2C shows an enlarged diagram of a portion of an active layer 6. The current-non-injected region near the facet has a structure such that no current is injected by an oxide mask 13. It is assumed that the length of current-non-injected region lies within a range from 10 to 50 μm. A method of manufacturing the device will now be described. On an n-GaAs substrate 3, an n-GaAs buffer layer 4, an n-InGaP cladding layer 5 which is lattice-matched to the GaAs substrate, a strained-quantum well active layer 6 made up of GaAs barrier layers 16 and 18 and an In(z)Ga(1−z)As strained-quantum well active layer (z=0.16, the thickness of the well layer is 7 nm) 17, a p-InGaP cladding layer 7 which is lattice-matched to the GaAs substrate, a p-GaAs waveguide layer 8, a p-InGaP cladding layer 9 which is lattice-matched to the GaAs substrate and has a cross-section, taken on a plane orthogonal to the optical axis, such that at an inner or vertically intermediate part thereof the cladding layer 9 is narrower than at other parts thereof nearer the waveguide layer 8 and nearer an upper surface thereof, and a p-GaAs cap layer 10 are sequentially formed by an MOCVD method or a gas source MBE method. Subsequently, a ridge as shown in FIGS. 2A and 2B is formed by a photolithography and etching process by using the oxide mask as an etching mask. In this instance, any one of the methods such as wet, RIE, RIBE, ion milling, and the like can be used as an etching method. The etching is performed so as to completely eliminate the p-GaAs waveguide layer 8 and to stop in the way of the p-InGaP cladding layer 7 so as not to reach the strained-quantum well active layer 6. A width of the ridge formed in this instance, lies within a range from 1 to 15 μm. Subsequently, the oxide mask used as an etching mask is further used as a mask for selective growth and an n-InGaP current-blocking layer 11 is selectively grown by an MOCVD method as shown in FIGS. 2A and 2B. After that, a wafer is taken out from a reactor and the oxide mask used as a selective growth mask is eliminated by an etching. Then, a p-GaAs contact layer 12 is formed by an MOCVD method or a gas source MBE method. After that, an oxide film or mask is formed by a CVD method and is patterned by a photolithography and etching process so that the oxide mask remains in only the current-non-injected region near the facet. After a p-electrode 14 and an n-electrode 15 are formed, a laser device of a cavity length of about 900 μm is obtained by a cleavage method. Subsequently, a low-reflective film having a thickness of λ/4 (λ: lasing wavelength) is formed on the front surface of the device and a high-reflective film by a four-layer film consisting of SiO$_2$ and a-Si is formed on the rear surface of the device. The device was bonded to a heat sink with the junction surface of the device down. The device manufactured as an experimental model had a ridge width of 3 μm and continuous wave operation was obtained at a room temperature by a threshold current of about 10 mA and had a lasing wavelength of about 980 nm. The device stably operated in a lateral single mode up to 400 mW. By further increasing the injection current, the device was thermally saturated, outputting the highest light output of 700 mW. When 30 devices were continuously driven by a predetermined light output of 100 mW under a condition of an ambient temperature of 60° C., all of the devices stably operated for a hundred thousand hours or longer, without any sudden failures.

Embodiment 2

Figure 5:
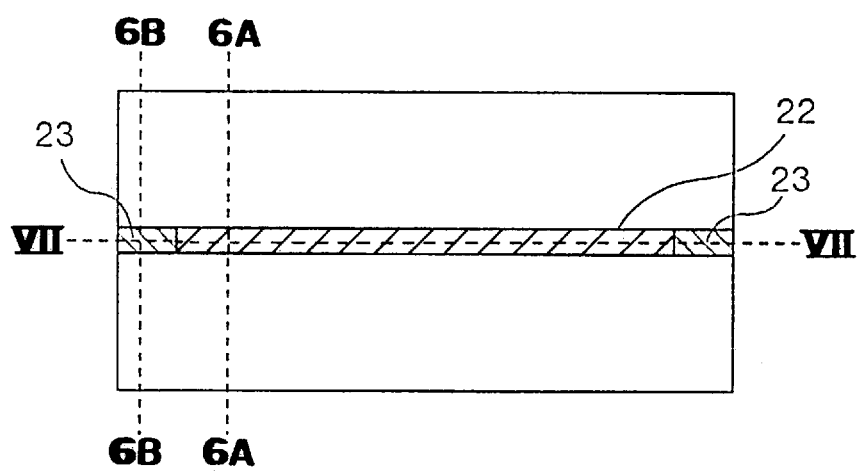
FIG. 5 is a diagram showing a top view of the second embodiment according to the invention.
Figure 6A:
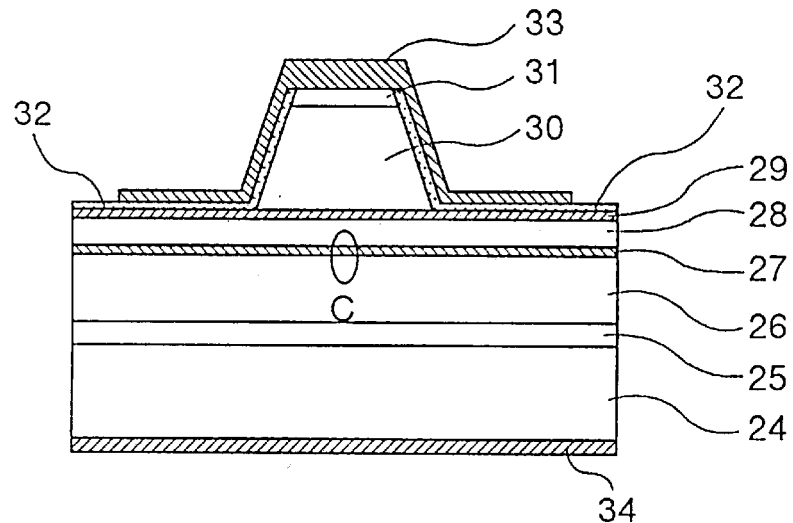
FIG. 6A is a cross sectional view taken along the line 6A—6A in FIG. 5.
Figure 6B:
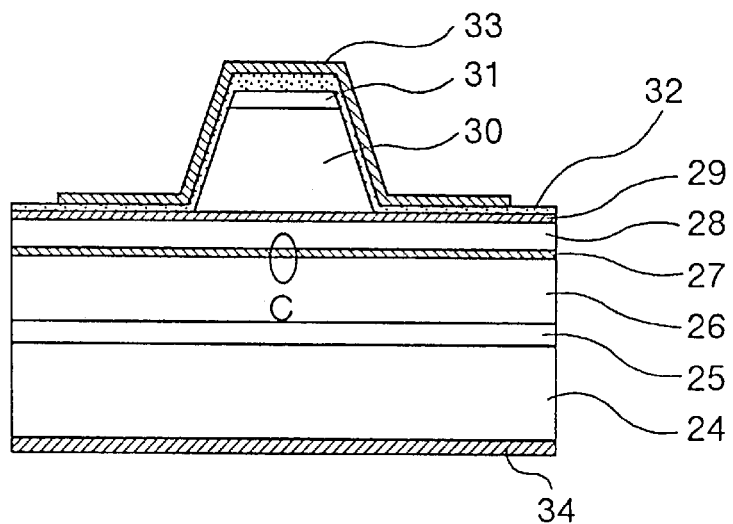
FIG. 6B is a cross sectional view taken along the line 6B—6B in FIG. 5.
Figure 6C:
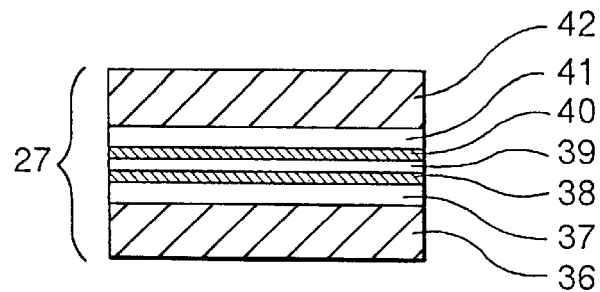
FIG. 6C is an enlarged diagram of an active layer portion C in FIGS. 6A and 6B.
Figure 7:
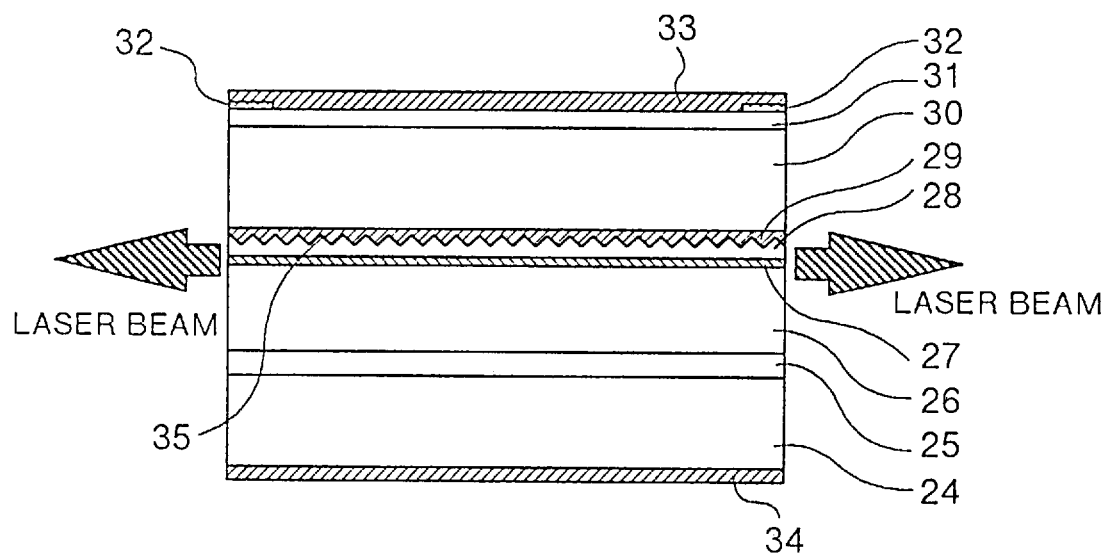
FIG. 7 is a cross sectional view taken along the line VII—VII in FIG. 5.

The second embodiment of the invention will now be described with reference to FIGS. 5 to 7. FIG. 5 shows a top view of a device. As shown in FIG. 5, a stripe is made up of a current-injected region 22 in the device and a current-non-injected region 23 of a portion near a facet. FIGS. 6A and 6B show cross sectional structures taken along the lines 6A—6A and 6B—6B in FIG. 5. FIG. 6C shows an enlarged diagram of a portion of an active layer 27. The current-non-injected region near the facet has a structure such that no current is injected by an oxide mask 32. In this instance, it is assumed that a length of current-non-injected region lies within a range from 10 to 50 μm. FIG. 7 shows a cross sectional structure taken along the line VII—VII in FIG. 5. A method of manufacturing the device will now be described. On an n-GaAs substrate 24, an n-GaAs buffer layer 25, an n-Al(x)Ga(1−x)As cladding layer (x=0.4) 26, a strained-quantum well active layer 27 made up of Al(y)Ga(1−y)As SCH (Separate Confinement Heterostructure) layers (y=0.2) 36 and 42, GaAs barrier layers 37, 39, and 41, and In(z)Ga(1−z)As strained-quantum well layers (z=0.16, a thickness of well layer is 7 nm) 38 and 40, and a p-Al(x)Ga(1−x)As cladding layer (x=0.4) 28 are sequentially formed by an MOCVD method, a CBE method, or an MBE method. After that, a second order grating 35 is formed by a holographic method as shown in FIG. 7. In this instance, it is assumed that a pitch of grating is equal to about 300 nm. Subsequently, a p-GaAs waveguide layer 29, a p-Al(x)Ga(1−x)As cladding layer 30 (x=0.4), a p-GaAs contact layer 31 are sequentially formed by an MOCVD method, a CBE method, or an MBE method. A ridge as shown in FIG. 6 is formed by a photolithography and etching process while using the oxide mask as an etching mask. Any one of the methods such as wet, RIE, RIBE, ion milling, and the like can be used as an etching method. It is assumed that a width of ridge in this instance lies within a range from 1 to 15 μm. After the oxide film used as an etching mask was eliminated, the oxide mask 32 is formed for current blocking. At this time, in the current-injected region in the device, a window for electrode contact is formed in an upper portion of the stripe as shown in FIG. 6A. In the current-non-injected region near a facet, an oxide mask is formed on the whole surface of the device as shown in FIG. 6B. After that, a p-electrode 33 and an n-electrode 34 are formed and a laser device having a cavity length of about 900 μm is obtained by a cleavage method. After that, a low-reflective film having a thickness of λ/4 (λ: lasing wavelength) and made of $Al_2O_3$ is formed on the front surface of the device and a high-reflective film by a four-layer film made of $SiO_2$ and a-Si is formed on the rear surface of the device. After that, the device was bonded on a heat sink, with the junction surface of the device up. The device manufactured as an experimental model had a ridge width of 3 μm and continuous wave operation was obtained at a room temperature in a DFB mode, with a threshold current of about 10 mA and had a lasing wavelength of about 980 nm. 0.5 Å/K was obtained as a temperature dependency characteristic of the lasing wavelength. The device stably operated in a lateral single mode up to 400 mW. When the injection current is further increased, the device is thermally saturated, outputting the highest light output of 700 mW. When thirty devices were continuously driven by a predetermined light output of 100 mW under a condition of an ambient temperature of 60° C., all of the devices stably operated for a hundred thousand hours or longer without any sudden failures. In place of the second order grating by the holography method, a first order grating of a pitch of 150 nm by an electron beam direct drawing method can be also used.

Embodiment 3

Figure 8:
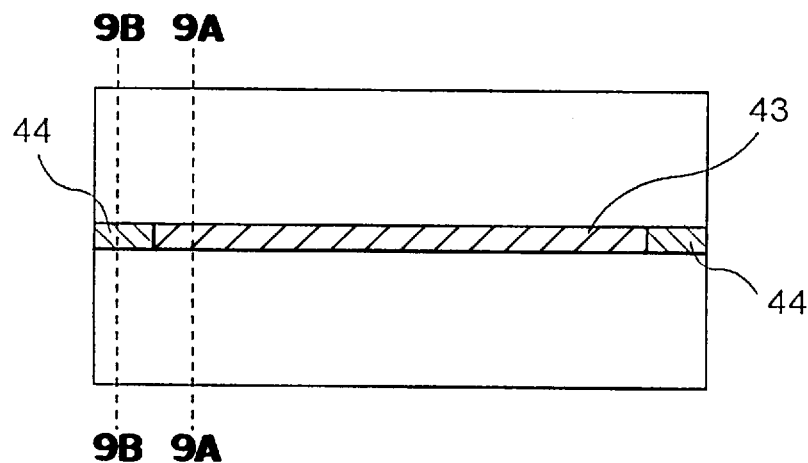
FIG. 8 is a diagram showing a top view of the third embodiment according to the invention.
Figure 9A:
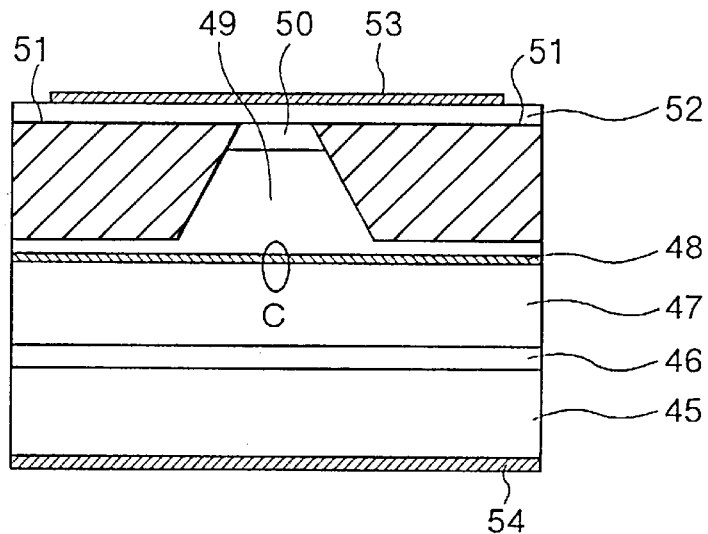
FIG. 9A is a cross sectional view taken along the line 9A—9A in FIG. 8.
Figure 9B:
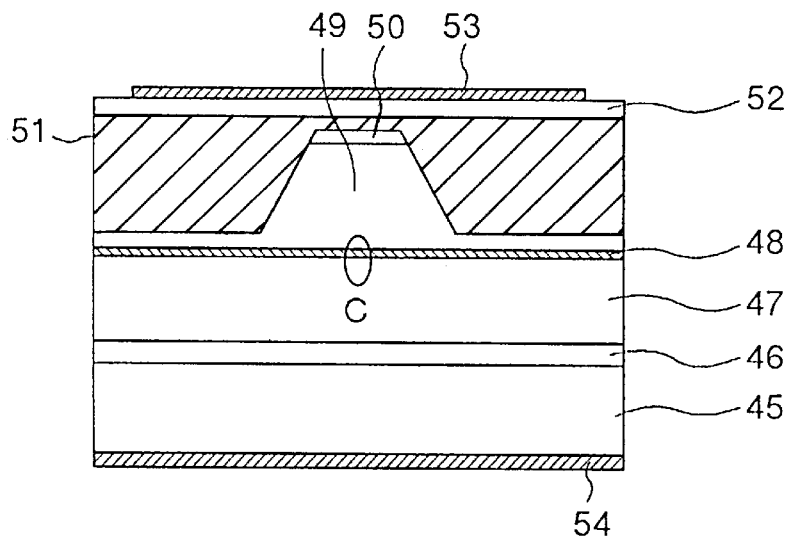
FIG. 9B is a cross sectional view taken along the line 9B—9B in FIG. 8.
Figure 9C:
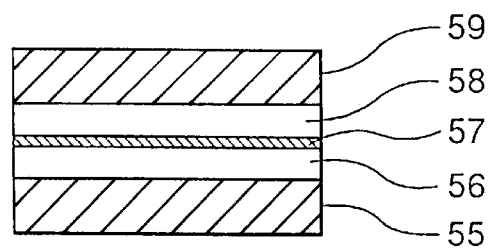
FIG. 9C is an enlarged diagram of an active layer portion C in FIGS. 9A and 9B.

The third embodiment of the invention will now be described with reference to FIGS. 8 and 9. FIG. 8 shows a top view of a device. As shown in FIG. 8, a stripe is made up of a current-injected region 43 in the device and a current-non-injected region 44 of a portion near a facet. FIGS. 9A and 9B show cross sectional structures taken along the lines 9A—9A and 9B—9B in FIG. 8. FIG. 9C shows an enlarged diagram of a portion of an active layer 48. The current-non-injected region near the facet has a structure such that no current is injected by an n-InGaP current-blocking low-refractive-index layer 51. In this instance, it is assumed that the length of current-non-injected region lies within a range from 10 to 50 μm. A method of manufacturing the device will now be described. On an n-GaAs substrate 45, an n-GaAs buffer layer 46, an n-In(1−x)Ga(x)As(y)P(1−y) cladding layer (x=0.72, y=0.43) 47 which is lattice-matched to the GaAs substrate, a strained-quantum well active layer 48 made up of In(1−x)Ga(x)As(y)P(1−y) SCH layers (x=0.89, y=0.78) 55 and 59 which are lattice-matched to the GaAs substrate, GaAs barrier layers 56 and 58, and an In(z)Ga(1−z)As strained-quantum well layer (z=0.16, the thickness of the well layer is 7 nm) 57, a p-In(1−x)Ga(x)As(y)P(1−y) cladding layer (x=0.72, y=0.43) 49 which is lattice-matched to the GaAs substrate, and a p-GaAs cap layer 50 are sequentially formed by an MOCVD method or a gas source MBE method. Subsequently, a ridge as shown in FIGS. 9A and 9B is formed by a photolithography and etching process while using an oxide film as an etching mask. In this instance, any one of the methods such as wet, RIE, RIBE, ion milling, and the like can be used as an etching method. It is assumed that the width of ridge lies within a range from 1 to 15 μm. Subsequently, the portion of the current-non-injected region 44 of the oxide film used as an etching mask to form the ridge is eliminated by a photolithography and etching method. After that, the oxide mask is used as a mask for selective growth and the n-InGaP current-blocking low-refractive-index layer 51 is selectively grown by an MOCVD method as shown in FIGS. 9A and 9B. In this instance, since the oxide mask in the current-non-injected region 44 has been eliminated, the current-blocking layer 51 grows on the ridge of the current-non-injected region 44. Therefore, no current flows in such a portion. After that, a wafer is taken out from the reactor and the oxide film used as a selective growing mask is eliminated by etching. A p-GaAs contact layer 52 is formed by an MOCVD method or a gas source MBE method. After a p-electrode 53 and an n-electrode 54 are formed, a laser device having a cavity length of about 900 μm is obtained by a cleavage method. After that, a low-reflective film having a thickness of λ/4 (λ: lasing wavelength) made of $SiO_2$ is formed on the front surface of the device and a high-reflective film by a four-layer film made of $SiO_2$ and a-Si is formed on the rear surface of the device. Subsequently, the device was bonded on a heat sink with the junction surface of the device down. The device manufactured as an experimental model had a ridge width of 3 μm and continuous wave operation was obtained at a room temperature by a threshold current of about 10 mA and has a lasing wavelength of about 980 nm. The device stably operated in a lateral single mode up to 400 mW. When the injection current was further increased, the device was thermally saturated, outputting the highest light output of 700 mW. When thirty devices were continuously driven by a predetermined light output of 100 mW under a condition of an ambient temperature of 60° C., all of the devices stably operated for a hundred thousand hours or longer, without any sudden failures.

The active layer in the foregoing embodiments can be also replaced to a GRIN-SCH (Graded Index-Separate Confinement Heterostructure) active layer in which compositions of an SCH layer are changed step by step.

According to the invention, a semiconductor laser which stably operates for as long as a hundred thousand hours or longer can be realized as a light source for pumping an Er-doped fiber amplifier that is used in optical communication systems. Namely, since a device which does not cause a COD is realized, a semiconductor laser in which a life due to a gradual degradation is hundred thousand hours or more and a sudden failure due to an electric surge does not occur is realized.

What is claimed is:

1. A semiconductor laser device having a cavity structure for lasing formed on a semiconductor substrate, comprising:

an active layer region including at least one quantum well for generating light;

a first cladding layer for confining the light and formed on a side of said active layer region opposite a side thereof facing towards said semiconductor substrate, said first cladding layer consisting of a stripe-shaped ridge portion extending between facets of said cavity structure, and another portion different from said ridge portion; and current injection means for injecting a current to said ridge portion while excluding both regions near facets of said cavity structure, wherein said stripe-shaped ridge portion and the other portion of said first cladding layer are separated by a waveguide layer which has a refractive index higher than that of said first cladding layer and lower than that of said at least one quantum well, wherein said waveguide layer has a striped shape limited by said ridge portion and is formed on an upper surface of the other portion of said first cladding layer, said waveguide layer being formed of material selected from such materials that said first cladding layer regrows thereon, and wherein said first cladding layer has a cross-sectional configuration, taken on a plane orthogonal to an optical axis, such that at an inner part thereof, above said waveguide layer, said first cladding layer is narrower than at parts thereof nearer said waveguide layer and nearer an upper surface of said ridge portion, respectively.

2. A semiconductor laser device according to claim 1, wherein said semiconductor substrate includes a GaAs substrate and both said portions of said first cladding layer are constituted by separate semiconductor layers of the same material and conductivity and are lattice-matched to said semiconductor substrate.

3. A semiconductor laser device according to claim 2, wherein each said portion of said first cladding layer consists of an InGaP layer or InGaAsP layer.

4. A semiconductor laser device according to claim 3, wherein a length of a current-non-injected region adjacent to the facets of said cavity structure lies within a range of from 10 $\mu$m to 50 $\mu$m.

5. A semiconductor laser device according to claim 1, wherein a length of a current-non-injected region adjacent to the facets of said cavity structure lies within a range of from 10 $\mu$m to 50 $\mu$m.

6. A semiconductor laser device according to claim 1, wherein said at least one quantum well includes at least one InGaAs layer.

7. A semiconductor laser device according to claim 4, wherein said at least one quantum well includes at least one InGaAs layer.

8. A semiconductor laser device according to claim 1, wherein said at least one quantum well includes an InGaAs layer.

9. A semiconductor laser device according to claim 4, wherein said at least one quantum well includes an InGaAs layer.

10. A semiconductor laser device according to claim 1, further comprising a second cladding layer and a buffer layer, wherein said buffer layer is interposed between said semiconductor substrate and said second cladding layer, said buffer layer and said second cladding layer being of opposite conductivity to that of said first cladding layer, and wherein said active layer region is interposed between said another portion of said first cladding layer and said second cladding layer.

11. A semiconductor laser device according to claim 10, wherein said at least one quantum well includes an InGaAs layer.

12. A semiconductor laser device having a cavity structure for lasing formed on a semiconductor substrate, comprising:

an active layer region;

a first semiconductor region having an inner surface formed on a side of said active layer region opposite a side thereof facing towards said semiconductor substrate, said first semiconductor region being of a first conductivity type and consisting of a stripe-shaped ridge portion extending between facets of said cavity structure, and another portion different from said stripe-shaped ridge portion;

a current supplying region in contact with an outer surface of said ridge portion for supplying a current via said ridge portion to said active layer region; and a second semiconductor region formed on an outer surface of the other portion of said first semiconductor region by selective growth so as to contact directly with both side surfaces of said ridge portion, said second semiconductor region being of a second conductivity type, opposite said first conductivity type, so as to block said current from flowing outside of said ridge portion, wherein said second semiconductor region is formed on the outer surface of said ridge portion so as to isolate said ridge portion from said current supplying region near both facets of said cavity structure, wherein said first semiconductor region has a cross-sectional configuration, taken on a plane orthogonal to an optical axis, such that said first semiconductor region is narrower at an inner part thereof than at parts thereof nearer said inner surface and nearer said outer surface, respectively, and wherein said current supplying region contacts with the outer surface of said ridge portion separated from both facets of said cavity structure.

13. A semiconductor laser device according to claim 12, wherein said second semiconductor region includes a current-blocking low-refractive-index layer, and wherein said active layer consists of at least one quantum well for generating light.

14. A semiconductor laser device according to claim 13, wherein said at least one quantum well includes an InGaAs layer.

15. A semiconductor laser device according to claim 13, wherein said at least one quantum well includes an In(z)Ga(1−z)As layer, in which Z=0.16, and has a thickness of about 7 nm.

16. A semiconductor laser device according to claim 15, further comprising a cladding layer and a buffer layer which are of said second conductivity type, wherein said buffer layer is interposed between said semiconductor substrate and said cladding layer, and said active layer region is interposed between said cladding layer and the inner surface of said first semiconductor region.

17. A semiconductor laser device according to claim 13, wherein said another portion of said first semiconductor region includes a first cladding layer and said ridge portion thereof includes a cap layer as a constituent element.

18. A semiconductor laser device according to claim 17, further comprising a second cladding layer and a buffer layer which are of said second conductivity type, wherein said buffer layer is interposed between said semiconductor substrate and said second cladding layer, and said active layer region is interposed between said second cladding layer and the inner surface of said first semiconductor layer.

19. A semiconductor laser device according to claim 18, wherein said first and second cladding layers include an InGaAsP layer but are doped to have opposite conductivity types, respectively, and wherein said semiconductor substrate and said buffer layer are constituted by GaAs material and have the same conductivity type.

20. A semiconductor laser device according to claim 19, wherein said at least one quantum well includes at least one InGaAs layer.

21. A semiconductor laser device according to claim 12, wherein said first semiconductor region includes at least one layer formed of InGaP or InGaAsP material.

22. A semiconductor laser device according to claim 18, wherein said second cladding layer includes at least one layer formed of InGaP or InGaAsP material.

23. A semiconductor laser device according to claim 18, wherein said first and second cladding layers include at least one layer formed of InGaP or InGaAsP material.

24. A semiconductor laser device according to claim 12, wherein a region adjacent each facet is a current-non-injected region having a length which is within a range of from 10 $\mu$m to 50 $\mu$m.

25. A semiconductor laser device having a cavity structure for lasing formed on a semiconductor substrate, comprising:

an active layer region including at least one quantum well for generating light;

a first cladding layer for confining the light and formed on a side of said active layer region opposite a side thereof facing towards said semiconductor substrate, said first cladding layer being of a first conductivity type and including (1) a first elongated protruding portion extending between facets of said cavity structure, and (2) an underlying second portion directly on said active layer region;

current means electrically connected to said elongated protruding portion for supplying a current via the protruding portion to said active layer region; and a semiconductor region formed on an outer surface of the second portion of said cladding region by selective growth so as to contact directly with both side surfaces of said elongated protruding portion, said semiconductor region being of a second conductivity type, opposite said first conductivity type, so as to block said current from flowing outside of said elongated protruding portion, wherein said first cladding layer has a cross-sectional configuration, taken on a plane orthogonal to an optical axis, such that said elongated protruding portion thereof is narrower at an inner part thereof than at parts thereof nearer said second portion and nearer an outer surface of the protruding portion, respectively, wherein said current means is in electrical contact with the outer surface of said elongated protruding portion, the protruding portion being separated from both of two facets of said cavity structure, and wherein said current means is precluded from supplying current to said active layer region via regions near the facets.

26. A semiconductor laser device according to claim 25, further comprising a second cladding layer and a buffer layer, wherein said buffer layer is interposed between said semiconductor substrate and said second cladding layer, said buffer layer and said second cladding layer being of opposite conductivity to that of said first cladding layer, and wherein said active layer region includes at least one quantum well and is interposed between said second portion of said first cladding layer and said second cladding layer.

27. A semiconductor laser device according to claim 26, wherein said elongated protruding portion and said another portion of said first cladding layer are separated by a waveguide layer which has a refractive index higher than that of said first cladding layer and lower than that of said at least one quantum well, wherein said waveguide layer has a striped shape limited by the protruding portion and is formed on an upper surface of the other portion of said first cladding layer.

28. A semiconductor laser device according to claim 27, wherein said semiconductor substrate includes a GaAs substrate and said first cladding layer includes an InGaAsP layer and is lattice-matched to said semiconductor substrate.

29. A semiconductor laser device according to claim 26, wherein said first and second cladding layers consist of an InGaP layer or InGaAsP layer, respectively.

30. A semiconductor laser device according to claim 25, wherein a length of each region adjacent each respective facet, in which injection of current is prevented, lies within a range of from 10 $\mu$m to 50 $\mu$m.

31. A semiconductor laser device according to claim 25, wherein said at least one quantum well includes at least one InGaAs layer.

32. A semiconductor laser device according to claim 28, wherein said semiconductor region is formed on the outer surface of the protruding portion so as to isolate the protruding portion from said current means near both facets of said cavity structure.

33. A semiconductor laser device according to claim 25, mwherein said semiconductor region is formed on the outer surface of the protruding portion so as to isolate the protruding portion from said current means near both facets of said cavity structure.

34. A semiconductor laser device according to claim 33, wherein said semiconductor region includes a current-blocking low-refractive-index layer, and wherein said active layer consists of at least one quantum well for generating light.

35. A semiconductor laser device according to claim 25, wherein said elongated protruding portion has a stripe-shaped cap layer provided thereon, said cap layer directly coupling said current means to said outer surface of said elongated protruding portion.

36. A semiconductor laser device according to claim 35, wherein a length of each region adjacent each respective facet, in which injection of current is prevented, lies within a range of from 10 $\mu$m to 50 $\mu$m.

* * * * *